(12) United States Patent
Rezeanu

(10) Patent No.: US 6,789,180 B1
(45) Date of Patent: Sep. 7, 2004

(54) METHOD AND APPARATUS FOR MASK AND/OR COUNTER ADDRESS REGISTERS READBACK ON THE ADDRESS BUS IN SYNCHRONOUS SINGLE AND MULTI-PORT MEMORIES

(75) Inventor: Stefan-Cristian Rezeanu, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 298 days.

(21) Appl. No.: 09/966,838

(22) Filed: Sep. 28, 2001

(51) Int. Cl.[7] .............................................. G06F 12/00
(52) U.S. Cl. ........................ 711/217; 712/5; 365/238.5
(58) Field of Search ......................... 711/149, 201–202, 711/212, 217, 219; 365/236, 238.5; 710/22, 307; 326/40; 712/5

(56) References Cited

U.S. PATENT DOCUMENTS

| | | | | |
|---|---|---|---|---|
| 4,852,049 A | * | 7/1989 | Sakai ........................... | 711/214 |
| 5,548,786 A | * | 8/1996 | Amini et al. .................. | 710/22 |
| 5,590,287 A | * | 12/1996 | Zeller et al. ................. | 710/307 |
| 5,619,670 A | * | 4/1997 | Shindo ......................... | 711/202 |
| 5,832,290 A | * | 11/1998 | Gostin et al. .................. | 712/5 |
| 5,850,368 A | * | 12/1998 | Ong et al. ................ | 365/238.5 |
| 6,230,250 B1 | * | 5/2001 | Vogley ........................ | 711/218 |
| 6,388,464 B1 | * | 5/2002 | Lacey et al. ................... | 326/40 |
| 6,510,483 B1 | * | 1/2003 | Rezeanu et al. ............ | 710/307 |
| 6,570,866 B1 | * | 5/2003 | Murase et al. .............. | 370/351 |

OTHER PUBLICATIONS

Stefan–Cristian Rezeanu et al., "Circuit, Architecture and Method for Reading an Address Counter and/or Matching a Bus Width Through One or More Synchronous Ports", U.S. Ser. No. 09/531,365, filed Mar. 21, 2000.

"3.3V 64K and 18 Synchronous QuadPort™ Static RAM", Cypress Preliminary CY7C0430BV, Cypress Semiconductor Corporation, Mar. 27, 2001, pp. 1–36.

"3.3V 16K/32K×36 FLEx36™ Asynchronous Dual–Port Static RAM", Cypress Preliminary CY7C056V/CY7C057V, Cypress Semiconductor Corporation, Nov. 22, 2000, pp. 1–22.

"Understanding The FLEx36 Dual–Port SRAMs", Cypress Semiconductor Corporation, Oct. 21, 1999, pp. 1–9.

* cited by examiner

*Primary Examiner*—Nasser Moazzami
(74) *Attorney, Agent, or Firm*—Christopher P. Maiorana, P.C.

(57) ABSTRACT

An apparatus comprising a memory device and one or more control circuits. The memory device may be configured to store and retrieve data. The one or more control circuits may be configured to control access to the memory device. Each of the control circuits may be configured to provide a readback of an internal address value when in a first state and a readback of a mask value when in a second state.

18 Claims, 8 Drawing Sheets

METHOD AND APPARATUS FOR MASK AND/OR COUNTER ADDRESS REGISTERS READBACK ON THE ADDRESS BUS IN SYNCHRONOUS SINGLE AND MULTI-PORT MEMORIES

CROSS REFERENCE TO RELATED APPLICATIONS

The present application may relate to co-pending application Ser. No. 09/895,114, filed Jun. 29, 2001, which is hereby incorporated by reference in its entirety.

FIELD OF THE INVENTION

The present invention relates to a method and/or architecture for implementing memories generally and, more particularly, to a method and/or architecture for externally reading, on an address bus, the content of either the internal address provided by an address counter/register or a mask register.

BACKGROUND OF THE INVENTION

Typical circuits for reading an address counter/register and matching bus widths through synchronous ports have drawbacks. Such circuits allow the readback of solely the address counter/register, while placing the internal address bits on an external data bus. Typical circuits use complex I/O routing and tristate control logic to allow the readback operation to take place on the I/O data bus. Typical circuits also require loading of the data bus with arbitration/demultiplexing circuits in order to externally extract the address information during a readback operation.

In the case of a larger address bus size, compared with the size of the data bus, the readback operation requires two clock cycles to present the internal address bits to the external data lines. Since the circuit performs the readback operation on the data I/O bus, the effect is reduced data bus speed due to multiple-loaded buses on the data ports. The circuit also requires complex readback control to allow suitable matching between the size of the address and I/O bus, either by tristating the I/O lines not needed in readback mode or implementing a state machine when a size of the readback address is larger than the external I/O bus.

When the address bus size exceeds the I/O bus size, the typical circuit requires one additional clock cycle, slowing down the system. For example, in a multi-port 1 Meg SRAM, internally configured as a x36 memory (i.e., long word format), there are (i) 15 bits readback if bus-matching is not active (i.e., having a x36 I/O bus), (ii) 16 bits readback if bus-matching with an external I/O format of x18 (i.e., a word) and/or (iii) 17 bits readback in two clock cycles if bus-matching with an external I/O format of x9 (i.e., a byte) is configured through the bus-matching specific controls.

SUMMARY OF THE INVENTION

The present invention concerns an apparatus comprising a memory device and one or more control circuits. The memory device may be configured to store and retrieve data. The one or more control circuits may be configured to control access to the memory device. Each of the control circuits may be configured to provide a readback of an internal address value when in a first state and a readback of a mask value when in a second state.

The objects, features and advantages of the present invention include providing a method and/or architecture for externally reading, on an address bus, the content of either an internal address provided by an address counter/register when in a first state or a mask register when in a second state that may (i) avoid additional loading of data lines such that external devices may capture mask or internal counter address information at improved speeds, (ii) allow a system designer to make use of single loaded buses on any data port, (iii) maximize data bus speed, (iv) improve overall system speed, (v) provide reduced complexity of readback control devices, (vi) present readback mask/counter bits to the address bus during a single clock cycle, independently of the relative size of the address and I/O buses, (vii) eliminate (or reduce) the need for arbitration/multiplexing schemes on the data I/O bus, and/or (viii) maneuver I/O address related items on the address bus.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
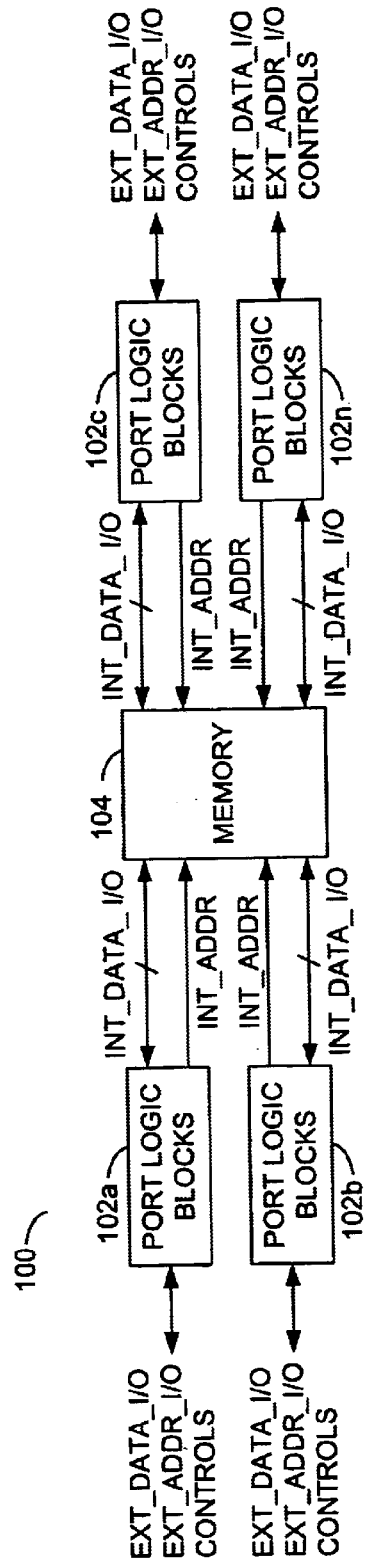
FIG. 1 is a block diagram of a preferred embodiment of the present invention.

Referring to FIG. 1, a block diagram of a circuit (or device) 100 is shown in accordance with a preferred embodiment of the present invention. The circuit 100 generally comprises a number of blocks (or circuits) 102a–102n and a device memory 104. In one example, the circuits 102a–102n may be implemented as port logic block circuits. In another example, the circuits 102a–102n may be implemented as port address and data I/O control devices. The circuits 102a–102n may be configured to communicate with the memory device 104 through a number of signals (e.g., INT_DATA_I/O and INT_ADDR). The circuits 102a–102n may be configured to communicate with external devices (not shown) through a number of signals (e.g., CONTROLS, EX_DATA_I/O and EX_ADDR_I/O). The signal INT_DATA_I/O may be implemented as a multi-bit internal data I/O bus. The signal INT_ADDR may be implemented as a multi-bit internal address bus. The signal CONTROLS may be implemented as a multi-bit control bus. In one example, the signal CONTROLS may implement unidirectional input and output bits. The signal EX_DATA_I/O may be implemented as a multi-bit external data I/O bus. The signal EX_ADDR_I/O may be implemented as an external address I/O bus.

The circuit 100 may be configured to externally read on the address bus EX_ADDR_I/O, the contents of an address counter/register (within the circuit 102, not shown) when in a first state and a mask register (within the circuit 102, not shown) when in a second state (the address counter/register and the mask register will be described in connection with FIGS. 2, 3, 4 and 5).

The address counter/register may be configured to provide an internal address. The mask register may be configured to control an active size of the address counter/register. The circuit 100 may be configured to control the address bus EX_ADDR_I/O. The address bus EX_ADDR_I/O may be implemented as a mutually exclusive active input/output address bus. The circuit 100 may also provide a predetermined latency between input/output reads, writes and readbacks on the address bus EX_ADDR_I/O.

The circuit 100 may implement a readback scheme in conjunction with controlled latency that may improve speed of the data bus EX_DATA_I/O, as well as overall system speed. Additionally, the circuit 100 may implement readback control circuitry with reduced complexity (e.g., within each of the port logic blocks circuits 102a–102n). The circuit 100 may allow readback mask/counter bits to be transferred on the address bus EX_ADDR_I/O during a single clock cycle, independent of the relative size of the address bus EX_ADDR_I/O and the data bus EX_DATA_I/O.

The circuit 100 may not implement additional loading on the data lines EX_DATA_I/O for devices configured to capture the mask and/or internal counter address information. The circuit 100 may also allow a system designer to make use of single loaded data bus EX_DATA_I/O of the port logic blocks circuits 102a–102n, thereby maximizing the data bus speed.

In one example, the circuit 100 may be implemented as a 1-Mb synchronous quadport static RAM. However, other sizes and types of memories may be implemented accordingly to meet the design criteria of a particular implementation. The four ports (e.g., the circuits 102a–102n) may permit independent, simultaneous access for read/write from/to any location in the memory 104. For example, one of the ports 102a–102n may write to a particular location of the memory 104, while another port (or ports) may read from other locations or the same location simultaneously, the latter within certain timing constraints. However, the result of simultaneous writing to a particular location may be undefined.

Figure 2:
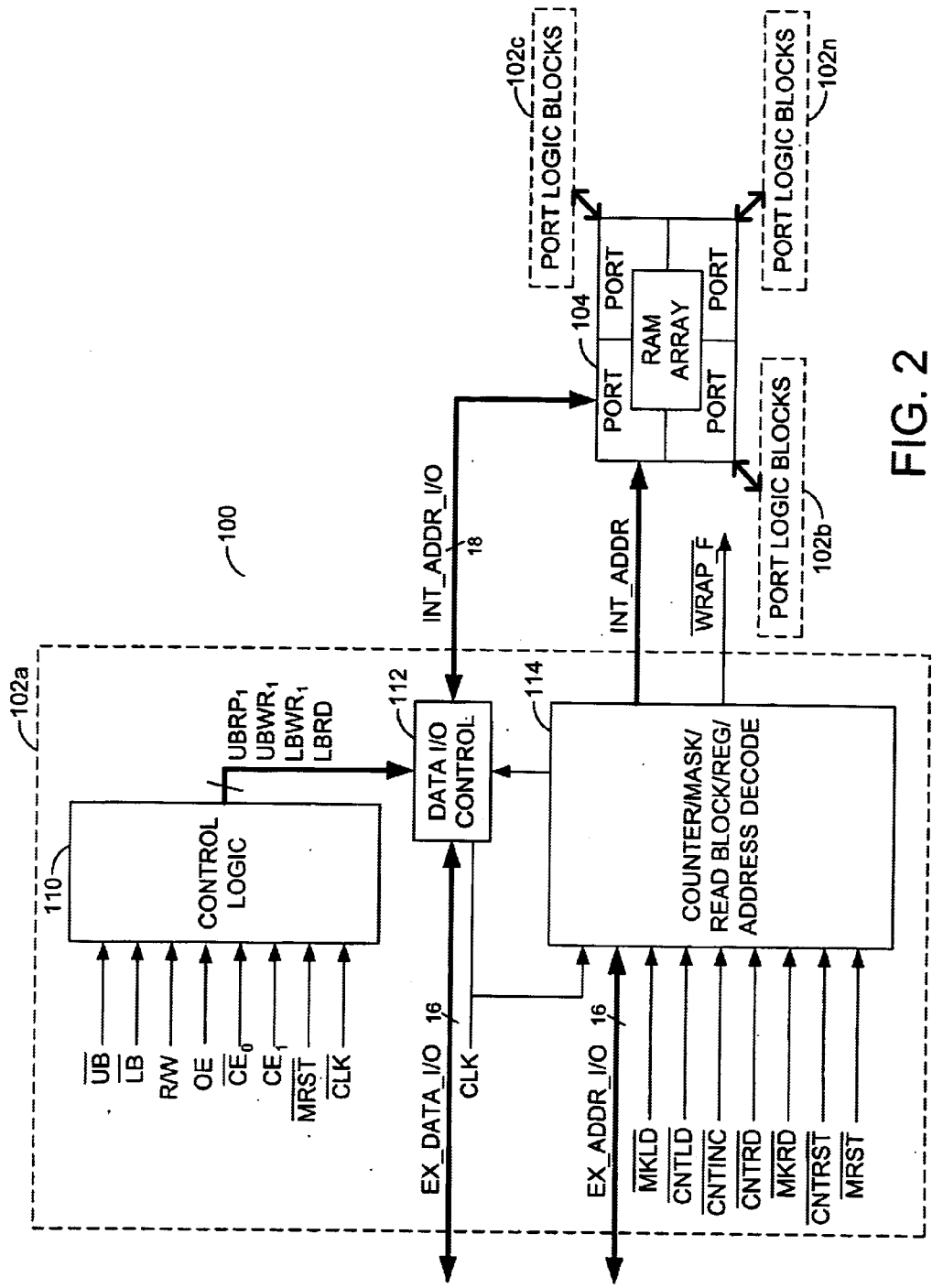
FIG. 2 is a detailed block diagram of the circuit of FIG. 1.

Referring to FIG. 2, a detailed block diagram of the circuit 100 is shown. The circuit 102a is shown comprising a control logic block (or circuit) 110, a data I/O control block (or circuit) 112 and a counter/mask/readback/register/address decoder block (or circuit) 114. The control logic 110 is generally configured to receive a number of signals (e.g., UBb, LBb, R/Wb, OEb, CE0b, CE1, MRSTb and CLK). The signal UBb may be implemented as an upper byte signal. The signal LBb may be implemented as a lower byte signal. The signal R/Wb may be implemented as a read/write signal. The signal OEb may be implemented as an output enable signal. The signals CE0b and CE1 may be implemented as chip enable signals. The signal MRSTb may be implemented as an asynchronous master reset signal activated either at power-up or by the user through a corresponding input line. The signal CLK may be implemented as an internal clock signal. The clock signal CLK may be a replica of the external (e.g., system) clock with an internally controlled duty cycle. The control logic circuit 110 may also present a number of signals (e.g., UBRD, UBWR, LBWR and LBRD) to the data I/O control circuit 112. The signal UBRD may be implemented as an upper byte read signal. The signal UBWR may be implemented as an upper byte write signal. The signal LBWR may be implemented as a lower byte write signal. The signal LBRD may be implemented as a lower byte read signal.

The data I/O control circuit 112 may receive the signals UBRD, UBWR, LBWR and LBRD. The data I/O control circuit 112 may also present/receive a control signal (e.g., AOE), a signal CLK, and the external data signal EX_DATA_I/O. The signal AOE may be implemented as an address output enable control signal. The data I/O control circuit 112 may also interface with the memory device 104 via the data bus INT_DATA_I/O.

The circuit 114 may present the signal AOE, receive a number of control signals (e.g., MKLDb, CNTLDb, CNTINCb, CNTRDb, MKRDb, CNTRSTb, and MRSTb) and receive the signal CLK. The signal MKLDb may be implemented as a mask register load signal. The signal CNTLDb may be implemented as a counter register load signal. The signal CNTRDb may be implemented as a counter read signal. The signal MKRDb may be implemented as a mask read signal. The signal CNTRSTb may be implemented as a counter reset signal. The circuit 114 may also present the internal address signals INT_ADDR and a wraparound (or last-state-in-sequence) flag (e.g., WRAP_Fb). The circuit 114 may also interface externally via the external address bus EX_ADDR_I/O.

The circuit 114 may be implemented as a single/multi-port counter with mask and readback capability and/or a synchronous address counter with reset (e.g., asynchronous and synchronous) parallel load, variable width incrementation, and/or wrap around flagging capability. In a particular case the counter will be considered to be 16-bits wide (e.g., in the following description). The circuit 114 may also include a 16-bit synchronous mask register with parallel load and asynchronous/synchronous initialization capability, for controlling the wrap around address for the 16-bit synchronous counter. The wrap around address value is generally restricted to: $2^n-1$, $0<n\leq16$. The wrap around flag WRAP_Fb may activated for one clock cycle after the unmasked portion of the counter is reset through an incrementation operation. Because the user may simultaneously activate several of the control signals, conflicting external simultaneously active control pin states may be eliminated internally.

The circuit 114 generally provides one cycle latency readback capability on the bi-directional address lines EX_ADDR_I/O. The circuit 114 may also provide internal automatic tristate capability of the external data I/O bus EX_DATA_I/O, during counter/address or mask register readback.

Figure 3:
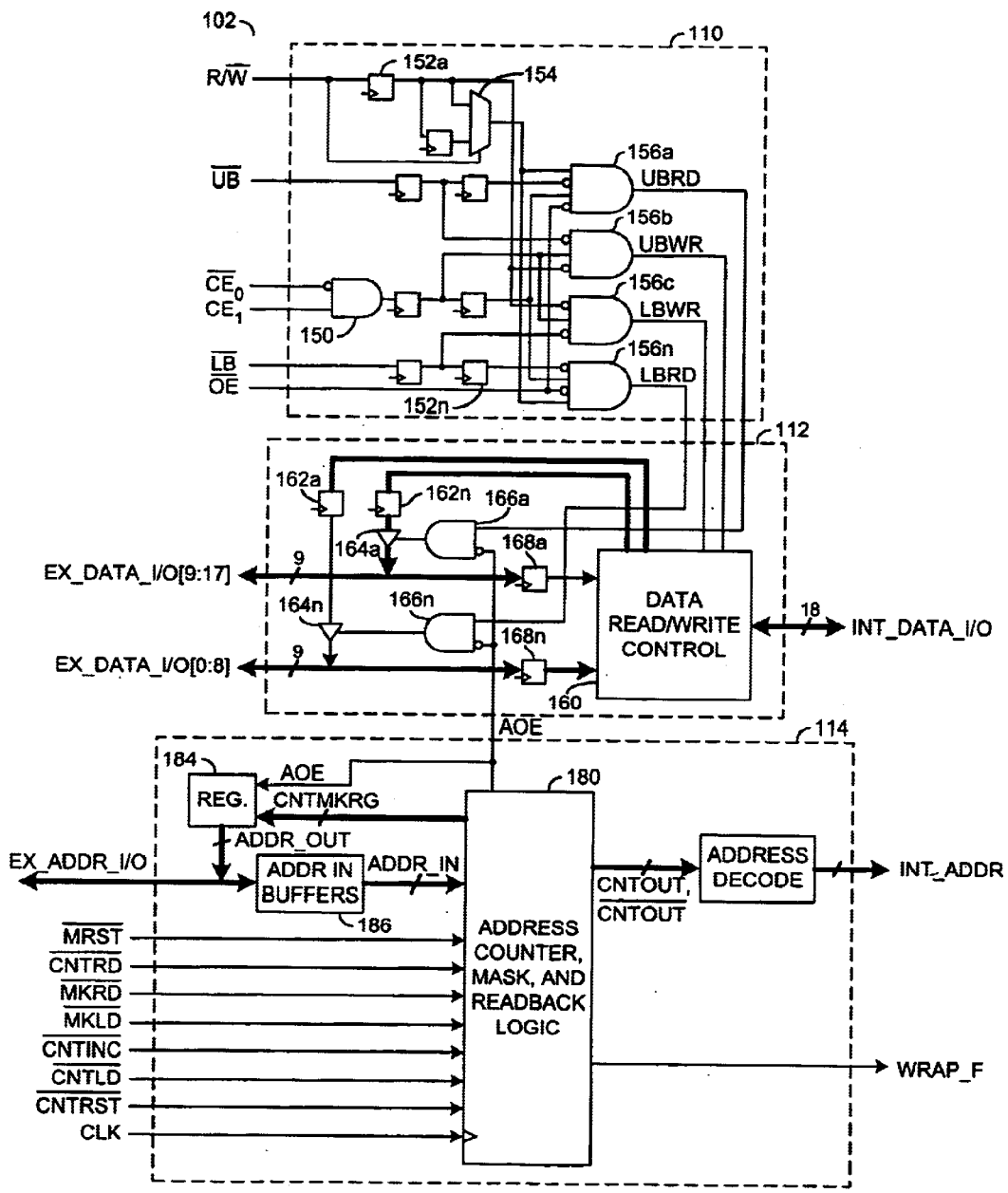
FIG. 3 is a more detailed block diagram of the circuit of FIGS. 1 and 2.

Referring to FIG. 3, a detailed block diagram of the port 102a is shown. The ports 102b–102n may have a similar implementation as the port 102a. The control circuit 110 may be implemented as a read/write control logic circuit. The read/write control logic circuit 110 generally comprises a gate 150, a number of latches 152a–152n, a multiplexer 154 and a number of gates 156a–156n. The latches 152a–152n may be coupled in series and/or parallel with the gates 156a–156n. The latches 152a–152n may be configured to receive the signals R/Wb, UBb, LBb, and a logic combination of the multiple chip enable signals (e.g., CE0b and CE1). The chip enable signals CE0b and CE1 are shown in FIG. 3. However, the circuit 100 may implement another appropriate number and/or configuration of chip enable signals. The latches 152a–152n and the multiplexer 154 may be configured to present signals to the gates 156a–156n. The gates 156a–156n may also receive the signal OEb. The gate 156a may present the signal UBRD. The gate 156b may present the signal UBWR. The gate 156c may present the signal LBWR. The gate 156n may present the signal LBRD. The gates 150 and 156a–156n may be implemented as multiple-input AND gates with one or more inverted inputs. However, other type of gates may be implemented in order to meet the criteria of a particular implementation. In one example, multiple chip enable signals (e.g., the circuit 100 is not limited to CE0b and CE1) and byte control signals (e.g., the circuit 100 is not limited to UBb and LBb) may be combined.

The data I/O control circuit 112 generally comprises a data read/write control circuit 160, a number of latches 162a–162n, a number of tristatable buffers 164a–164n, a number of gates 166a–166n and a number of latches 168a–168n. The data read/write control circuit 160 may be configured to present/receive the internal data bus INT_DATA_I/O and the external data bus EX_DATA_I/O (via the latches 168a–168n and the tristatable buffers 164a–164n). One or more of the gates 166a–166n may receive the address output enable signal AOE as well as the byte-controlled read signals (e.g., UBRD and LBRD). The gates 166a–166n may be implemented as AND gates with one or more inverted inputs. However, other type of gates may be implemented in order to meet the design criteria of a particular implementation.

The circuit 114 generally comprises an address counter, mask, and readback logic block (or circuit) 180, an address decoder block (or circuit) 182, a register with output tristate control block (or circuit) 184, and an address input buffer with controllable delay block (or circuit) 186. The circuit 180 may receive the signals MRSTb, CNTRDb, MKRDb, MKLDb, CNTINCb, CNTLDb, CNTRSTb, CLK and a signal (e.g., ADDR_IN). The circuit 180 may also present the signal WRAP_Fb, a signal (e.g., CNTOUT), a signal (e.g., CNTOUTb logic complement of the signal CNTOUT), a signal (e.g., CNTMKRG), and the signal AOE. The signals CNTOUT and CNTOUTb may be implemented as multi-bit buses. The address decode circuit 182 may receive one or both signals CNTOUT and CNTOUTb and present the signal INT_ADDR. The register with output tristate control circuit 184 may receive the signal CNTMKRG and the signal AOE. The circuit 184 may present a signal (e.g., ADDR_OUT) to the bidirectional external address I/O bus EX_ADDR_I/O. The buffers with controllable delay 186 may present the address signal ADDR_IN in response to the signal EX_ADDR_I/O.

Figure 4:
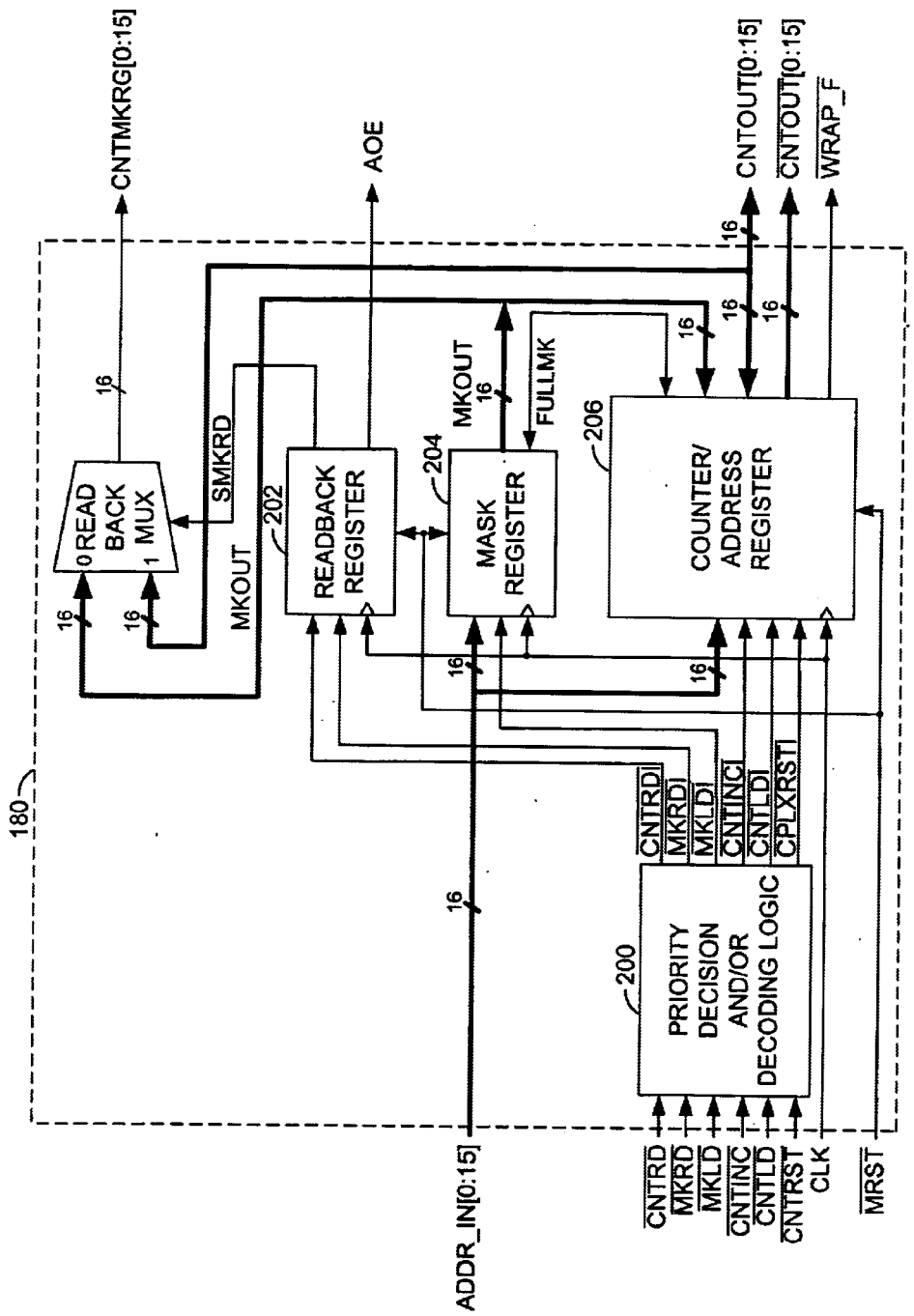
FIG. 4 is a detailed block diagram of the address counter, mask, and readback logic block of FIG. 3.

Referring to FIG. 4, a detailed block diagram of the address counter, mask, and readback logic circuit 180 is shown. The address counter, mask and readback circuit 180 may be independent of the chip enable signals CE0 and CE1 (unlike the data I/O control block 112). The circuit 180 generally comprises a priority decision and/or decoding logic block 200, a readback register 202, a mask register 204, a counter/address register 206 and a multiplexer 208.

The priority decision and/or decoding logic 200 may receive the signals CNTRDb, MKRDb, MKLDb, CNTINCb, CNTLDb, and CNTRSTb. The priority decision and/or decoding logic 200 may present a number of signals (e.g., CNTRDIb, MKRDIb, MKLDIb, CNTINCIb, CNTLDIb and CPLXRSTIb). The input signals CNTRDb, MKRDb, MKLDb, CNTINCb, CNTLDb and CNTRSTb may be presented to circuit 200 as fully or partially decoded control signals.

The priority decision and/or decoding logic block 200 generally receives one or more active inputs at a time (e.g., the input signals CNTRDb, MKRDb, MKLDb, CNTINCb, CNTLDb and CNTRSTb). In one example, the input signals CNTRDb, MKLDb, CNTINCb, CNTLDb and CNTRSTb may be active low. Outputs of the priority decision and/or decoding logic circuit 200 (e.g., the output signals CNTRDIb, MKRDIb, MKLDIb, CNTINLIb, CNTLDIb and CPLXRSTIb) may be inactive, except for a maximum of one active output signal (e.g., the signal having the highest precedence as shown in TABLE 2).

The readback register 202 may receive the signals CNTRDIb, MKRDIb, CLK and MRSTb. The readback register 202 may also present a signal (e.g., SMKRDb) and the signal AOE. The readback register 202 may register the signals CNTRDIb and MKRDIb at an active transition of the clock CLK. The signal SMKRDb may be implemented as an active low select mask readback signal. The signal SMKRDb may be a synchronous output activated by the mask register readback register 202 via the signal MKRDIb. The signal AOE may be implemented as an active high address output enable. The signal AOE may be a synchronous output activated with a cycle latency by either the signal CNTRDIb or the signal MKRDIb being active when registered. The MRSTb signal may be implemented as an active low master reset signal. The signal MRSTb may be an asynchronous input that when asserted, deactivates AOE (e.g., a reset) and SMKRDb (e.g., a set).

The mask register 204 may receive the signal ADDR_IN, MKLDIb, CLK, and MRSTb. The mask register 204 may also present a signal (e.g., MKOUT) and a control signal (e.g., FULLMK). The signal MKOUT may be implemented as a multi-bit bus. The control signal FULLMK may be implemented as a full mask indication signal. The mask register 204 may allow the bus MKOUT to be output and the bus ADDR_IN to be registered on a positive edge of the clock CLK, if the signal MKLDIb is asserted. The signal MKLDIb may be an active low synchronous input. The registered input address value ADDR_IN may be restricted to: $2^n-1$, $0<n\leq 16$ or $2^n-2$, $2<n\leq 16$. The bus MKOUT may have a contiguous string of 0s (on the MSB side), followed by a contiguous string of 1s (on the LSB side). However, the LSB may be either 0 or 1, even when following a contiguous string of 1s.

The counter/address register 206 may receive the signals ADDR_IN, CNTINCIb, CNTLDIb, CPLXRSTIb, CLK, MRSTb, MKOUT, and FULLMK. The counter/address register 206 may also present the signal CNTOUT, CNTOUTb and the signal WRAP_Fb. The circuit 100 may allow a user to choose not to include the LSB in the unmasked portion of the counter/address register 206 and increment the circuit 206 by 2 at each positive clock transition. An "all 1s" content of the mask register (e.g., all counter bits unmasked) may be allowed, and may even be implemented as a result of the activation of the MRSTb signal. An "all 0s" content of the mask register (e.g., all counter bits masked) may be discouraged. Deactivation of the signal CNTINCb may have a similar effect.

However, if the user decides to load the "all 0s" state in the mask register 204, the signal FULLMK may be activated, and the counter interrupt flag WRAP_Fb may be internally forced inactive, as long as the counter/address register 206 does not have at least one bit unmasked. The signal FULLMK may be implemented as a full counter masked signal. The signal WRAP_Fb may be implemented as an active low counter interrupt signal. The MRSTb signal may be asserted to set the bus MKOUT. The signal MRSTb may force an "all is" content of the mask register 204, unmasking all the bits of the counter/address register 206.

The counter/address register 206 may allow the signal WRAP_Fb to be active for one cycle after the unmasked portion of the counter/address register 206 is reset through the incrementation operation. The signal CNTOUT may be output and the signal ADDR_IN may be registered if the signal CNTLDIb is asserted. The signal CNTLDIb may be an active low asynchronous input. The masked bits of the counter/address register 206 may be frozen (corresponding to the 0s in the LSB and/or MSB ranks of the input bus MKOUT). The unmasked portion of the counter/address register 206 (corresponding to the is in the input bus MKOUT) may be incremented at the active clock CLK edge if CNTINCIb is asserted. The signal CNTINCIb may be an active low asynchronous input. If the signal CNTRSTIb is asserted, a bus reset may occur at the active clock edge CLK. The signal CNTRSTIb may be an active low asynchronous input. If the signal MRSTb is asserted, the output CNTOUT may be reset, and the logic complement CNTOUTb may consequently be set.

The signals listed in TABLE 1 may be synchronous or asynchronous, with the exception of the signal MRSTb which is usually asynchronous. A control pin functionality of each signal may be detailed. Additionally, the output AOE may become active with one cycle latency with respect to the cycle when the corresponding readback control pin is latched active.

TABLE 1

| Pin Name | I/O | polarity | Description |
| --- | --- | --- | --- |
| ADDR_IN | input bus | N/A | Address input bus |
| CNTRDb | input | active low | Counter/Address register readback control |
| MKRDb | input | active low | Mask Register readback control |
| MKLDb | input | active low | Mask Register load control |
| CNTINCb | input | active low | Counter/Address register increment control |
| CNTLDb | input | active low | Counter/Address Register load control |
| CNTRSTb | input | active low | Counter/Address Register reset control |
| CLK | input | active edge | Clock - the leading edge latches controls |
| MRSTb | input | active low | Master reset asynchronous control |
| CNTMKRG | output bus | N/A | Readback output bus |

TABLE 1-continued

| Pin Name | I/O | polarity | Description |
| --- | --- | --- | --- |
| AOE | output | active high | Address output enable control |
| CNTOUT | output bus | N/A | Counter/Address register outputs (true) |
| CNTOUTb | output bus | Logic complement of CNTOUT | Counter/Address register output (complement) |
| WRAP_Fb | output | active low | Counter interrupt (e.g. wrap around) flag |

An example precedence table including the modes of operation of the circuit 180 is shown in the following TABLE 2, where RDBK refers to the readback register 202, MK refers to the mask register 204, and CNT refers to the counter/address register 206.

TABLE 2

| CLK | MRSTb | CNTRSTb | MKLDb | CNTLDb | CNTIINCb | CNTRDb | MKRDb | Mode | Operation |
| --- | --- | --- | --- | --- | --- | --- | --- | --- | --- |
| X | L | X | X | X | X | X | X | Master Reset | CNT reset, MK and RDBK set |
| L-H | H | L | X | X | X | X | X | Reset | CNT reset |
| L-H | H | H | L | X | X | X | X | MK-Load | Load ADDR_IN into MK |
| L-H | H | H | H | L | X | X | X | CNT-Load | Load ADDR_IN into CNT |
| L-H | H | H | H | H | L | X | X | CNT-Incr | CNT increment |
| L-H | H | H | H | H | H | L | X | CNT-Read | Readback content of CNT |
| L-H | H | H | H | H | H | H | L | MK-Read | Readback content of MK |
| L-H | H | H | H | H | H | H | H | Hold | CNT hold |

Figure 5:
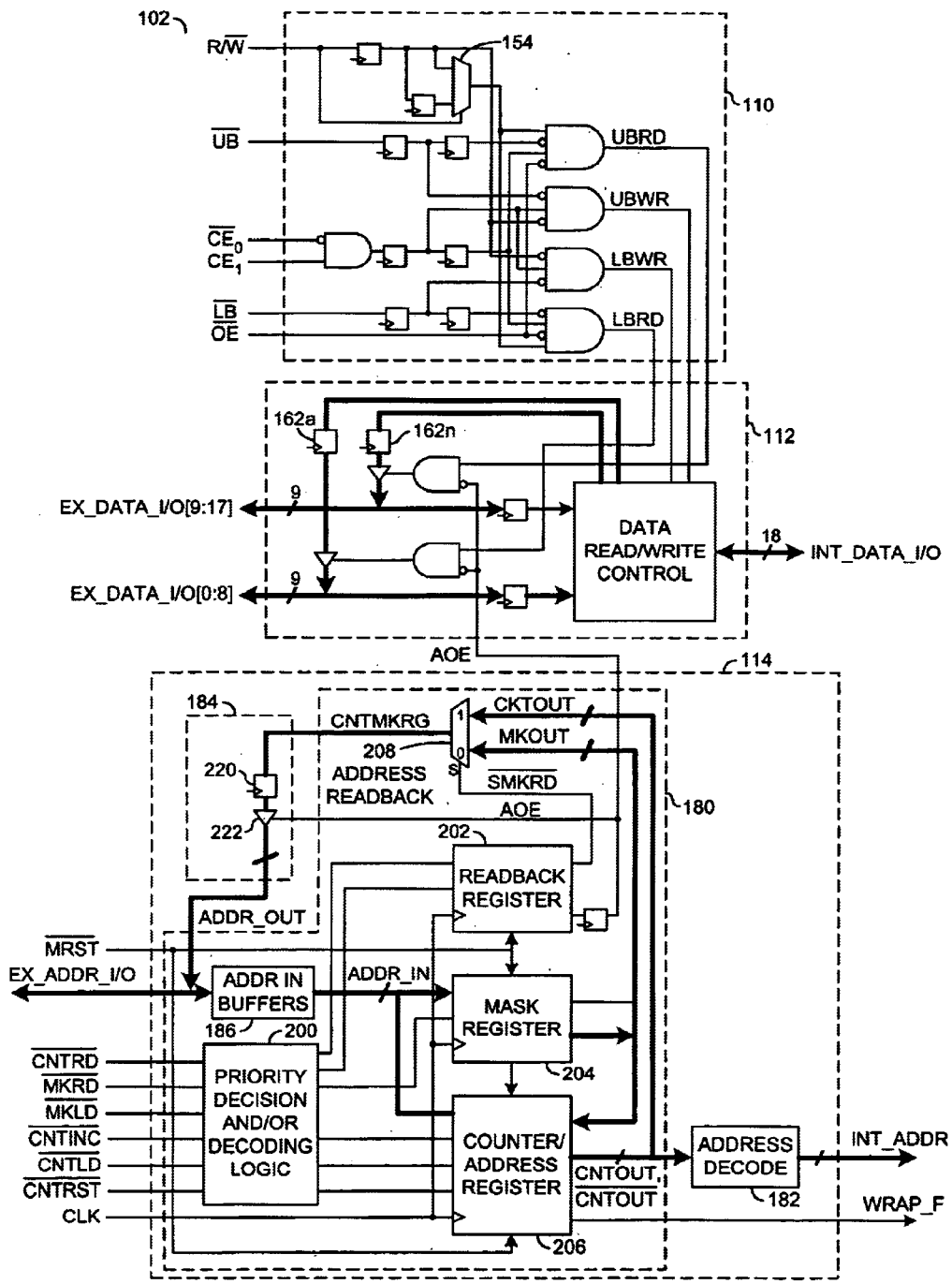
FIG. 5 is a detailed overview of the present invention.

Referring to FIG. 5, an overview of the port logic blocks circuit 102a is shown. The circuits 102b–102n may be similar to the circuit 102a. The register with output tristate control 184 is shown comprising a latch 220 and a tristatable buffer 222. The tristatable buffer 222 may control the address output lines ADDR_OUT, tapping into the bidirectional external address bus EX_ADDR I/O. The circuit 102 may implement registers on control, address and data lines to allow for minimal set-up and hold times, as well as decreased cycle time and clock to data valid time.

After externally loading the counter/address register 206 with the initial address ADDR_IN, the counter/address register 206 may then be configured to self-increment the initial address internally. The internal write pulse width may be independent of the duration of the input signal R/Wb. The internal write pulse may also be self-timed to allow the shortest possible cycle time. Also, for example, a HIGH on CE0b or LOW on CE1 for one clock cycle may power down the internal circuitry of the memory device, except the counter/mask register/address decode circuit 114, to reduce static power consumption. Additionally, a cycle may be needed for the chip enable signals CE0b and CE1 to be asserted to reactivate the outputs via the data I/O control 112. Additional counter enable inputs may be provided, usually requiring the circuit 200 to perform decoding operations, to stall the operation of the address input ADDR_IN and utilize the internal address generated by the internal counter/address register 206 for fast interleaved memory applications.

Readback condition detection is performed in the priority decision and/or decoding logic block 200. The circuit 200 may be configured to provide either a mask readback control signal (e.g., the signal MKRDIb) or a counter readback control signal (e.g., the signal CNTRDIb) in a mutually exclusive fashion with respect to each other as well as to the other mask/counter control signals (e.g., reset, load, increment, etc.).

The circuit 100 may allow the readback address bus ADDR_OUT on the EX_ADDR_I/O (e.g., address readback) and the output data bus EX_DATA_I/O (e.g., normal read) latency to be similar. In one example, the latency may be one clock cycle (e.g., a standard pipe-line delay). The latency for the readback address EX_ADDR_I/O and related tristate control for the data bus EX_DATA_I/O may be provided via the address output enable signal AOE. The readback address CNTMKRG may be registered one cycle later than the particular readback control signal (e.g., the mask signal MKRDb or the counter signal CNTRDb).

For improved latency tracking in FIG. 5, the latches 220 and 224 are depicted outside the readback register block 202. As soon as a readback condition is synchronously detected at a control pin via the signal MKRDb or CNTRDb, the mask or internal address data (selected by the MUX 208) is registered via the bus CNTMKRG and then read via the ADDR_OUT bus during the following clock cycle. The internal address signals CNTOUT and CNTOUTb, becoming INT_ADDR for the array in-pitch circuitry may have no latency. An exception may occur for tristate control, since no latency for writing is provided. The differentiation between read and write may be generically represented with a multiplexer 154 (part of the control logic block 110) controlled by the signal R/Wb.

Additionally, the circuit 100 may not require no-operation (e.g., counter hold) clock cycles in order to revert properly between address readback and regular read and write operations on the EX_ADDR_I/O bus.

Figure 6:
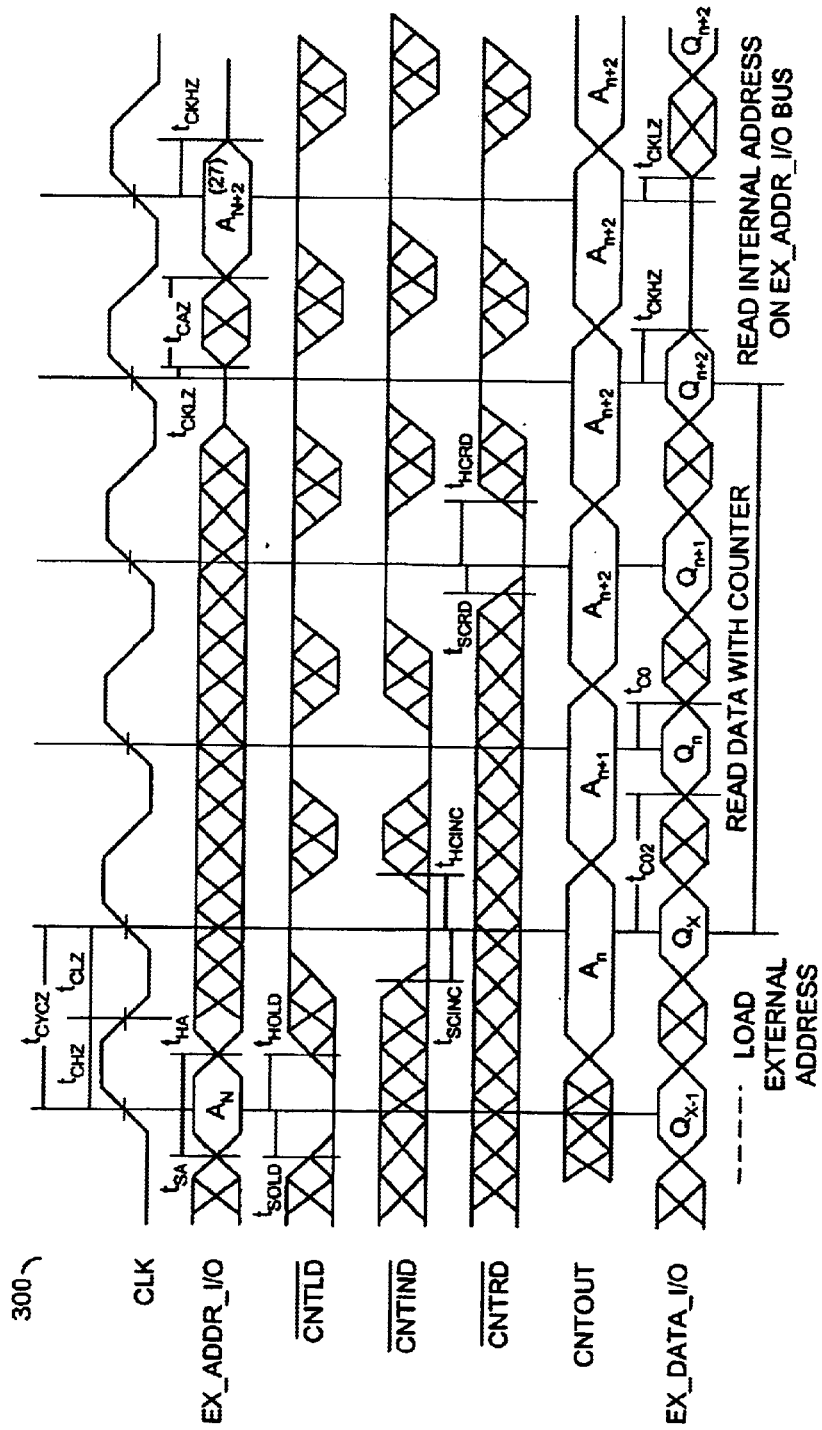
FIG. 6 is a timing diagram of an operation of the present invention.

Referring to FIG. 6, a timing diagram 300 illustrating a counter readback operation of the present invention is shown. The timing diagram 300 may illustrate three regular reads followed by a counter address readback cycle. The regular reads are done using a counter load with external address cycle, followed by two reads with address counter increment cycles.

Figure 7:
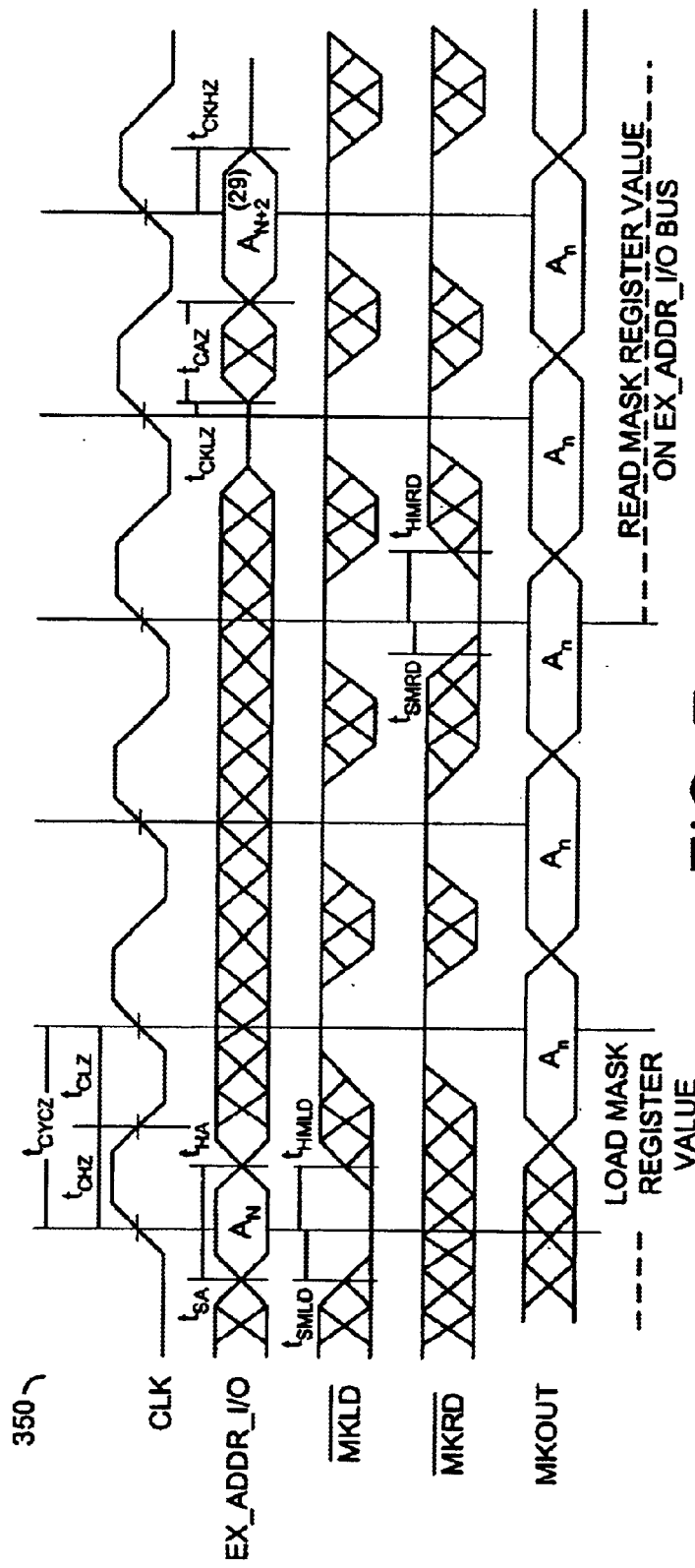
FIG. 7 is a timing diagram of an operation of the present invention.

Referring to FIG. 7, a timing diagram 350 illustrating an operation of the present invention is shown. The timing diagram 350 may illustrate a load mask register cycle, followed two cycles later by a read mask register cycle. The already described one cycle latency (standard pipe-line delay) characteristic to the operations should be noticed on the EX_ADDR_I/O bus in both FIGS. 6 and 7.

The counter or mask register values may be readback on the bidirectional address lines EX_ADDR_I/O by activating the signal CNTRDb or the signal MKRDb, respectively. Therefore, an external device may be configured to readback a counter internal address value on the address lines EX_ADDR_I/O and control counter wrap-around via the loaded mask value. For example, for a 16-bit counter, the mask register 204 may be loaded with 003F base 16 value selecting only the 6 LSBs of the counter to be unmasked, as illustrated in 400*a* of FIG. 8. The counter/address register 206 may be loaded in the unmasked portion with an initial value of 8 base 10. A "blocked" address counter segment 400*b* of FIG. 8 (e.g., the 7th address bit through the 16th address bit) may be loaded with an address, but will not generally be operated upon when the counter executes increment cycles. Therefore, the unmasked counter address may start at the address 8 base 10 and when the signal CNTINCb is asserted LOW, the counter/address register 206 may repeatedly increment the unmasked portion of the internal address until reaching the max-count value of 63 base 10 (400*c* of FIG. 8).

Figure 8:
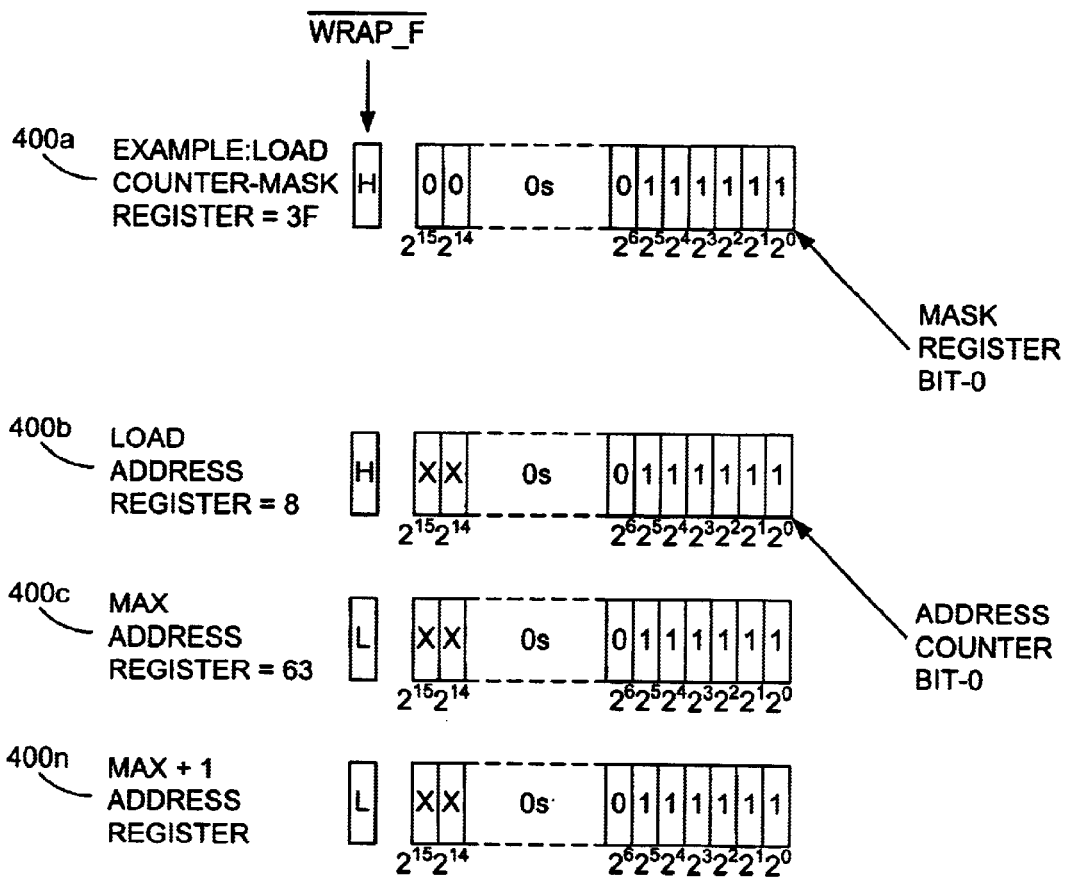
FIG. 8 is a block diagram illustrating the counter-mask interaction of the present invention.

The mask register value may cause the unmasked portion of the counter to wrap around to 0 in the next counter increment cycle, simultaneously activating the WRAP_Fb counter interrupt flag for one clock cycle (400*n* of FIG. 8). The definition 400*c* of FIG. 8 may be determined from the definition 400*b* either after 63–8=55 counter increment operations or with a direct address load (of 63=111111 in the unmasked portion of the counter). The definition 400*a* may be determined from the definition 400*c* after a counter wrap-around (e.g., for a counter increment operation executed on a counter whose unmasked portion content reached a maximum). Therefore, the counter/address register 206 may use the mask register 204 to implement a predetermined wrap-around point, keeping all its masked bits unchanged during the manipulation of the unmasked bits.

The counter/address register 206 and the mask register 204 may have the following operations:

(i) The load operation: When the signal CNTLDb or MKLDb is LOW, the counter/address register 206 or the mask register 204 may be loaded with the address value presented at the address lines ADDR_IN. In an example where the ADDR_IN line is 16 bits wide, the loaded value may range from 0000 to FFFF (base 16). The mask register load operation may have a higher priority over the address counter load operation.

(ii) The increment operation: Once the address counter/address register 206 is loaded with an external address, the counter/address register 206 may internally increment the address value by asserting CNTINCb LOW. The counter/address register 206 may address the entire memory array (depend on the value of the mask register 204) and loop back to location 0. The increment operation may be second in priority to the load operation.

(iii) The readback operation: The internal value of either the counter address register 206 or the mask register 204 may be read out on the bidirectional address lines EX_ADDR_I/O when the signal CNTRDb or MKRDb is LOW. Counter readback may have a higher priority over mask register readback. A no-operation delay cycle may be experienced when the readback operation is performed. The address may be valid after TCA2 (for counter readback) or TCM2 (for mask readback) from an active edge of the corresponding port's clock CLK, as shown in FIGS. 6 and 7, where the rising edge is the particular active edge chosen for the CLK signal. The address readback operation may be independent of the port chip enable signals (e.g., CE0b and CE1). If address readback occurs while the port is enabled (chip enables active), the external data I/O bus EX_DATA_I/O may be tri-stated.

(iv) The hold operation: In order to hold the value of the counter/address register 206 at a certain address, the signals CNTINCIb, CNTLDIb, and CNTCPXRSTIb may be HIGH. The hold operation may have the least priority. The operation may be useful in many applications where wait states are needed or when an address is available a few cycles ahead of the data. The counter and mask register operations may be independent of port chip enables.

Since the set-up and hold write parameters are measured at the external control pins, a maximum allowable delay (e.g., T) is accounted for, where T is the propagation delay from a control input of a port logic block (e.g., 102*a*–102*n*) to the input of the latches in the counter, mask or readback registers. T may be as fast and as even as possible across the control signals CNTRSTb, MKLDb, CNTLDb, CNTINCb, CNTRDb, and MKRDb.

The counter/address register 206 may be implemented on one port to increment by even addresses and the counter on another port to increment by odd addresses, thus effectively doubling the size of the data I/O bus between the two ports. The counter/address register 206 may allow the "increment by 2" mode on all the ports 102a–102n and flagging the wrap-around from either 11 . . . 110 to 00 . . . 000 or 11 . . . 111 to 00 . . . 001, by masking the LSB of the two counters as described in the following. The LSB of the mask is allowed to be either "0" or "1", even if the next significant rank (rank "1") is at logic "1". The circuit 100 may allow the LSB of the counter 206 to be masked (e.g., frozen). To achieve the desired (double word size) functionality on two ports, the user will have to load a "0" on the LSB of the mask register 204, and load the two LSBs of the two port's address counter registers 206 with a "0" on the even-address-increment port and with a "1" on the odd-address-increment port.

Three alternate embodiments are described below, allowing application specific variations of the main embodiment:

First, the no latency for write may be removed and replaced with a standard one clock cycle latency practiced in pipe line mode. In such an embodiment, the read/write multiplexer 154 may be removed, and the R/Wb latency scheme may become similar with the one on the signals UBb/LBb and the signals CE0b/CE1. Such a latency scheme may be similar to that of no bus latency (NoBL) parts.

Second, the one cycle latency in the data read EX_DATA_I/O following a write (i.e., tristated in the first read cycle following a write) may be removed. In such an embodiment, the first read cycle following the write may read out the latest data stored in the data output registers 162a–162n before the first in a possible series of writes. Stored data may be re-latched (e.g., refreshed) as long as write cycles are performed. The data output registers may be provided with a feedback loop controlled by an internal write signal.

Third, the address bus EX_ADDR_I/O may be readback in a flow-through fashion, with no latency after the activation of the readback operation. In such an embodiment, the address output enable AOE latch 224 and the mask/counter address output registers 220 may be eliminated (or by-passed).

The circuit 100 may allow improved overall system speed and reduced complexity of readback control circuitry, since the readback mask/counter bits are presented to the address bus EX_ADDR_I/O during a single cycle, independently of the relative size of the external address bus EX_ADDR_I/O and the external data bus EX_DATA_I/O. The circuit 100 may not require arbitration/multiplexing circuitry on the data bus EX_DATA_I/0, since only data is manipulated on the data lines EX_DATA_I/O, while address related items are being maneuvered exclusively on the address buses EX_ADDR_I/O. The circuit 100 may also allow a write cycle to occur with no latency, allowing significant improvement of the overall system speed.

The circuit 100 may append address readback circuitry to mask and address-counter registers. The circuit 100 may allow the priority decision and/or decoding logic block 200 to generate a unique set of counter control signals, where a maximum of one of its output signals may be active during any particular cycle. The circuit 100 may ensure specific latency between read/write on the external data bus EX_ADDR_I/O as well as readback on the address bus EX_ADDR_I/O. The circuit 100 may maximize the data bus EX_DATA_I/O speed by allowing creation of single-loaded buses on any data port. The circuit 100 may implement precedence logic before latching the internal readback control signals to increase readback speed in the case of a flow through type address readback operation. The circuit 100 may be particularly suited for synchronous SRAMs (single or multi-port), as well as asynchronous SRAMs (single or multi-port) for the purpose of synchronous testing.

The various signals of the present invention are generally "on" (e.g., a binary HIGH, or 1) or "off" (e.g., a binary LOW, or 0). However, the particular polarities of the on (e.g., asserted) and off (e.g., de-asserted) states of the signals may be adjusted (e.g., reversed) accordingly to meet the design criteria of a particular implementation.

The various signals of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

A memory device configured to store and retrieve data; and

One or more control circuits configured to control access to said memory device, wherein each of said control circuits is configured to present at an external interface (i) an internal address value when in a first state and (ii) a mask value when in a second state, wherein at least one of said internal address value and said mask value is configured to be presented to said external interface during a single clock cycle.

2. The apparatus according to claim 1, wherein said external interface is couplable to an address bus for addressing said memory device.

3. The apparatus according to claim 1, wherein presenting at said external interface is performed independently of relative sizes of an address and an I/O external buses.

4. The apparatus according to claim 1, wherein said internal address value comprises an address counter/register value.

5. The apparatus according to claim 1, wherein said control circuits comprise port address and data I/O control circuits.

6. The apparatus according to claim 1, wherein each of said control circuits comprise:

a control logic circuit configured to receive one or more control signals;

an I/O circuit configured to interface one or more I/O signals; and a circuit configured to present said internal address value and said mask value, wherein said I/O circuit is configured in response to said control logic circuit and said circuit.

7. The apparatus according to claim 1, wherein each of said control circuits comprises an address decoder circuit configured to present an internal address to said memory device.

8. The apparatus according to claim 1, wherein each of said control circuits comprises:

a priority decision logic circuit configured to determine a priority of said first and said second states;

a register configured to store a control value;

a mask register configured to store said mask value;

a counter/address register configured to store said internal address value; and a multiplexer configured to transfer an output from (i) said mask register and (ii) said counter/address register to a third circuit, one at a time.

9. The apparatus according to claim 8, wherein said third circuit comprises a register with output tristate control configured to ensure same latency between memory reads on a data I/O bus and presentation of said internal address value and said mask value on an address bus.

10. The apparatus according to claim 1, wherein each of said control circuits is configured to receive at least one read signal of one or more control signals for presenting at least one of said internal address value and said mask value.

11. The apparatus according to claim 10, wherein each of said control signals is selected from the group consisting of: (i) a read/write signal, (ii) a word block signal (iii) a group of chip enable signals (iv) an output enable signal, (v) a data I/O signal, (vi) a memory reset signal, (vii) an address I/O signal, (viii) a counter read signal, (ix) a mask read signal, (x) a mask load signal, (xi) a counter increment signal, (xii) a counter load signal, (xiii) a counter reset signal, and (xiv) a clock signal.

12. The apparatus according to claim 1, wherein said memory device and said one or more control circuits are configured as a quad port memory.

13. An apparatus comprising:
means for generating an internal address value for a memory device based on an external address value received on an address bus; and
means for driving to said address bus (i) said internal address value when in a first state and (ii) a mask value when in a second state, wherein at least one of said internal address value and said mask value is configured to be presented to said external interface during a single clock cycle.

14. A method for determining an internal address value and a mask value, comprising the steps of:
(A) generating said internal address value from an external address value received at an external interface; and
(B) driving to said external interface said internal address value when an a first state and said mask value when in a second state, wherein step (B) further comprises driving at least one of said internal address value and said mask value during a single clock cycle on said address bus.

15. The method according to claim 14, wherein step (B) further comprises driving an address bus coupled to said external interface.

16. The method according to claim 15, wherein step (B) further comprises driving said address bus independently of relative sizes of said address bus and an I/O external bus.

17. The method according to claim 14, wherein step (B) is further responsive to at least one read signal of one or more control signals configured to read at least one of said internal address value and said mask value.

18. The method according to claim 17, wherein each of said control signals is selected from the group consisting of: (i) a read/write signal, (ii) a word block signals, (iii) a group of chip enable signals, (iv) an output enable signal, (v) an I/O signal, (vi) a memory reset signal, (vii) an address signal, (viii) a counter read signal, (ix) a mask read signal, (x) a mask load signal, (xi) a counter increment signal, (xii) a counter load signal, (xiii) a counter reset signal, and (xiv) a clock signal.

* * * * *